(12) United States Patent
Rolandi et al.

(10) Patent No.: US 9,262,317 B2
(45) Date of Patent: *Feb. 16, 2016

(54) NON-VOLATILE CONFIGURATION FOR SERIAL NON-VOLATILE MEMORY

(71) Applicant: MICRON TECHNOLOGY, INC., Boise, ID (US)

(72) Inventors: Paolo Rolandi, Agrate Brianza (IT); Sandra Lospalluti, Catania (IT); Raffaele Bufano, Tremestieri Etneo (IT); Stefano Andreoli, Milan (IT); Tommaso Zerilli, Tremestieri Etneo (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/148,079

(22) Filed: Jan. 6, 2014

(65) Prior Publication Data
US 2014/0195723 A1    Jul. 10, 2014

Related U.S. Application Data

(63) Continuation of application No. 13/143,075, filed as application No. PCT/IB2008/055583 on Dec. 30, 2008, now Pat. No. 8,626,990.

(51) Int. Cl.
*G06F 12/00* (2006.01)
*G06F 12/02* (2006.01)
*G06F 9/445* (2006.01)
*G11C 16/10* (2006.01)
*G11C 16/20* (2006.01)

(52) U.S. Cl.
CPC ........ *G06F 12/0246* (2013.01); *G06F 9/44573* (2013.01); *G11C 16/10* (2013.01); *G11C 16/20* (2013.01); *G06F 2212/72* (2013.01)

(58) Field of Classification Search
CPC ............ G06F 12/0246; G06F 2212/72; G06F 9/44573
See application file for complete search history.

(56) References Cited

U.S. PATENT DOCUMENTS

| | | | | |
|---|---|---|---|---|
| 6,094,702 | A * | 7/2000 | Williams et al. | 711/101 |
| 2002/0008551 | A1 * | 1/2002 | Sevalia et al. | 327/105 |
| 2006/0085589 | A1 * | 4/2006 | Roohparvar | 711/103 |
| 2006/0227610 | A1 * | 10/2006 | Pascucci et al. | 365/185.17 |
| 2008/0165589 | A1 * | 7/2008 | Hung et al. | 365/189.04 |

* cited by examiner

*Primary Examiner* — Shawn X Gu
(74) *Attorney, Agent, or Firm* — Knobbe Martens Olson & Bear LLP

(57) ABSTRACT

Example embodiments for configuring a serial non-volatile memory device may comprise a non-volatile configuration register to store a configuration value received from the processor, the configuration value to specify one or more attributes of a memory access operation. The configuration value may be read at least in part in response to power being applied to the memory device.

20 Claims, 6 Drawing Sheets

NON-VOLATILE CONFIGURATION FOR SERIAL NON-VOLATILE MEMORY

RELATED APPLICATIONS

This application is a continuation application of U.S. patent application Ser. No. 13/143,075, filed Sep. 26, 2011, now U.S. Pat. No. 8,626,990, which is a 35 U.S.C. §371 national phase filing of and claims the benefit of priority to international application PCT/IB2008/055583, filed Dec. 30, 2008, titled Non-Volatile Configuration for Serial Non-Volatile Memory, the entireties of which are hereby incorporated by reference herein.

BACKGROUND

Subject matter disclosed herein may relate to non-volatile memory devices, and may relate more particularly to configuring non-volatile memory devices using non-volatile memory cells.

Non-volatile memory devices, including flash memory devices, may be found in a wide range of electronic devices. In particular, flash memory devices may be used in computers, digital cameras, cellular telephones, personal digital assistants, etc. For many applications, flash memory devices may store instructions to be executed on a processor, and in at least some of these applications, the processor may fetch instructions from the flash memory devices, such as, for example, in execute-in-place (XiP) implementations.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1:
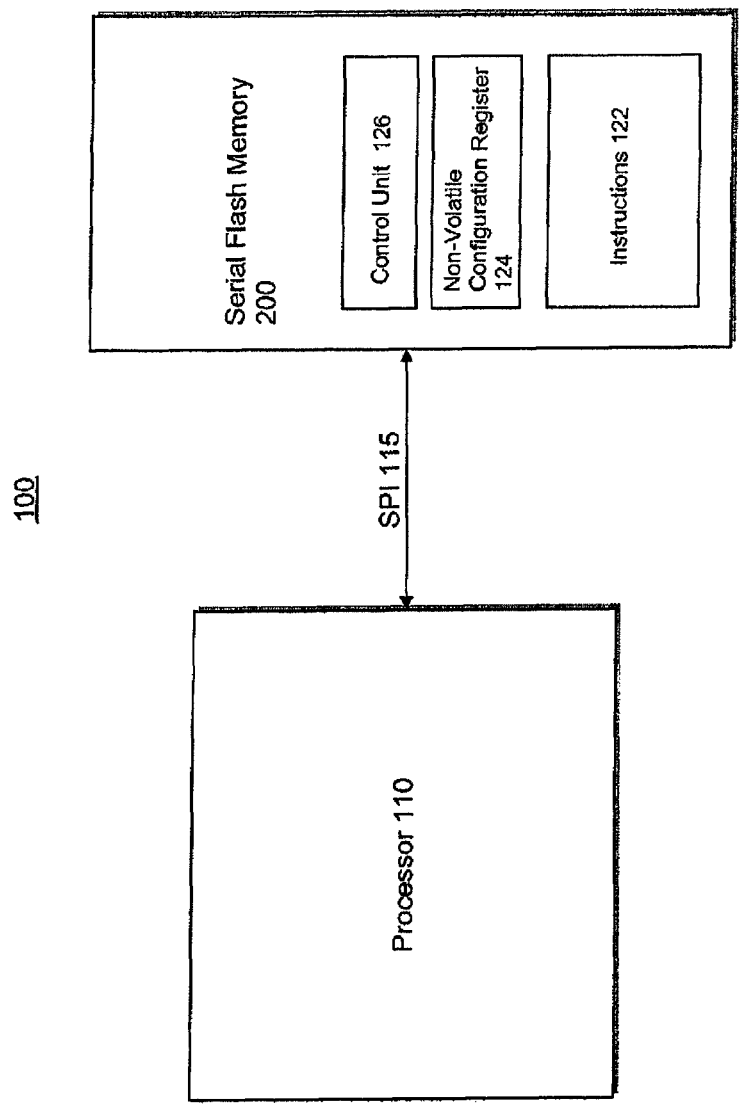
FIG. 1 is a block diagram of an example embodiment of a computing platform.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized. Furthermore, structural or logical changes may be made without departing from the scope of claimed subject matter. It should also be noted that directions or references, for example, up, down, top, bottom, and so on, may be used to facilitate discussion of the drawings and are not intended to restrict the application of claimed subject matter. Therefore, the following detailed description is not to be taken to limit the scope of claimed subject matter or their equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

Likewise, the terms, "and," "and/or," and "or" as used herein may include a variety of meanings that also is expected to depend at least in part upon the context in which such terms are used. Typically, "or" as well as "and/or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe some combination of features, structures or characteristics. Though, it should be noted that this is merely an illustrative example and claimed subject matter is not limited to this example.

As discussed above, for many applications, non-volatile memory devices such as flash memory devices may store instructions to be executed on a processor, and in at least some of these applications, the processor may fetch instructions from the flash memory devices, such as, for example, in execute-in-place (XiP) implementations. As used herein, the term "execute-in-place", along with its abbreviation "XiP", relates to a processor fetching instructions from a long term storage device, such as, for example, a flash memory, rather than fetching instructions from an intermediate storage, such as, for example, a dynamic random access memory (DRAM).

Flash memory may be characterized at least in part by the ability to be electrically erasable and programmable, and may be utilized in a very wide range of electronic device types, including, but not limited to, digital cameras, cellular telephones, personal digital assistants, portable navigation devices, portable music players, notebook computers, desktop computers, etc., to name but a few examples. Also, flash memory devices may comprise either parallel data interfaces or serial interfaces. Parallel interfaces, in at least some instances, may allow for relatively good data throughput due at least in part to increased numbers of input/output terminals. Serial interfaces, on the other hand, may provide reduced costs due at least in part to reduced numbers of input/output terminals. As system designers seek to provide increased performance while reducing costs, it may be advantageous to enhance the throughput of serial flash memory devices and/or to provide increased flexibility to meet any number of applications. For one or more embodiments, a non-volatile configuration register may be implemented to enable a serial flash memory device to be programmed to accommodate a variety of situations and/or applications, and to remember its configuration in the event of a power-down of the memory device. Upon a subsequent power-up, the memory device may refer to its non-volatile configuration register to determine the proper configuration in which to resume operation. Although example embodiments described herein discuss flash memory devices, the scope of claimed subject matter is not limited in this respect and other embodiment may utilize other types of nonvolatile memory devices. For example, one or more embodiments may include serial read-only memory (ROM), serial phase change memory (PCM), etc.

FIG. 1 is a block diagram of an example embodiment of a computing platform 100, comprising a processor 110 and a serial flash memory 200. Memory 200 for this example is coupled to processor 110 by way of a serial peripheral interface (SPI) 115, as discussed more fully below. For one or more embodiments, Serial Flash Memory 200 may comprise a control unit 126 and a configuration register 124. For one or more embodiments, configuration register 124 may comprise a non-volatile register. Also for one or more embodiments, non-volatile configuration register 124 may comprise one or more flash memory cells, although the scope of claimed subject matter is not limited in this respect. Further, memory 200 may store instructions 122 that may comprise code for any of a wide range of possible operating systems and/or applications. The instructions may be executed by processor 110. Note that for this example, processor 110 and memory 200 are configured as an execute-in-place (XiP) type implementation, where processor 110 may fetch instructions directly from a long-term storage device.

For one or more embodiments, control unit 126 may receive one or more signals from processor 110 and may generate one or more internal control signals to perform any of a number of operations, including data read operations, by which processor 110 may access instructions 122, for example. As used herein, the term "control unit" is meant to include any circuitry or logic involved in the management and/or execution of command sequences as they relate to flash memory devices.

The term "computing platform" as used herein refers to a system or a device that includes the ability to process or store data in the form of signals. Thus, a computing platform, in this context, may comprise hardware, software, firmware or any combination thereof. Computing platform 100, as depicted in FIG. 1, is merely one such example, and the scope of claimed subject matter is not limited in these respects. For one or more embodiments, a computing platform may comprise any of a wide range of digital electronic devices, including, but not limited to, personal desktop or notebook computers, high-definition televisions, digital versatile disc (DVD) players or recorders, game consoles, satellite television receivers, cellular telephones, personal digital assistants, mobile audio or video playback or recording devices, and so on. Further, unless specifically stated otherwise, a process as described herein, with reference to flow diagrams or otherwise, may also be executed or controlled, in whole or in part, by a computing platform. For the example embodiments described herein, computing platform 100 may comprise a cellular telephone, although again, the scope of claimed subject matter is not so limited.

Figure 2B:
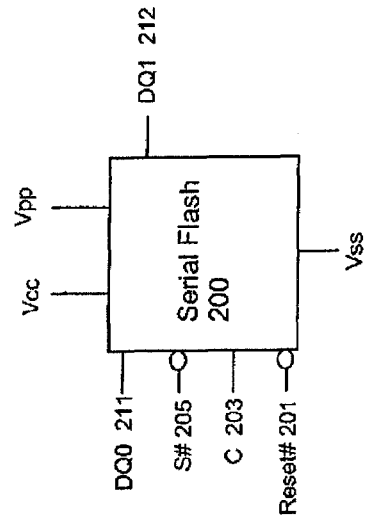
FIG. 2b is a block diagram depicting an example embodiment of a serial flash memory device configured for dual input/output operation.
Figure 2A:
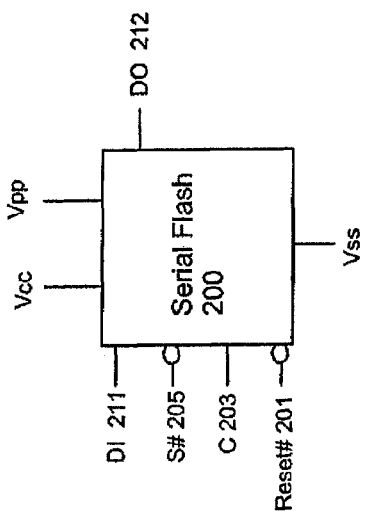
FIG. 2a is a block diagram depicting an example embodiment of a serial flash memory device configured for single input and single output operation.
Figure 2C:
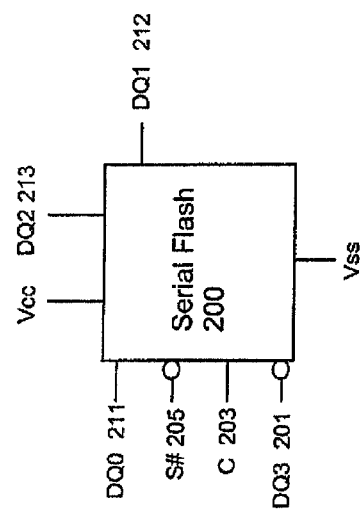
FIG. 2c is a block diagram depicting an example embodiment of a serial flash memory device configured for quad input/output operation.

As mentioned above, for an embodiment, processor 110 may be coupled to serial flash memory 200 by way of a serial peripheral interface 115. The term "serial peripheral interface" for an embodiment refers to a de facto standard for serial communications between components in some electronic devices. SPI 115 may comprise a number of signals, as will be discussed more fully below, including a clock signal, input/output signals, and a slave select signal. FIGS. 2a through 2c below, describe several modes of operation for SPI 115 as it relates to serial flash memory device 200, including single input/output interface operations, dual input/output interface operations, and quad input/output interface operations.

FIG. 2a is a block diagram depicting an example embodiment of a serial flash memory device configured for single input/output (I/O) interface operations. Serial flash memory 200 may comprise a terminal Vcc to be coupled to a power source, and a terminal Vpp that may also be coupled to a power source, but which may also have other purposes in other configurations, as discussed below. Memory 200 may also include a terminal Vss that may provide an electrical connection to a ground signal. Serial flash memory 200 for this example may also comprise a data input terminal DI 211 and a data output terminal DO 212, as well as a Reset# signal terminal 201, a clock C signal terminal 203, and a Slave (S#) signal 205. If serial flash memory 200 is operating in the single input, single output mode, information may be shifted into the memory via DI 211, and may be shifted out of the memory via DO 212. Also, for one or more embodiments, terminal 201 may be utilized for functions other than the reset function. For example, a HOLD# signal may be received at terminal 201 for one or more embodiments.

For an embodiment, an SPI command sequence may begin with a one byte command code that may be initiated with a falling edge of S# 205. The 8 bit command code may be latched into DI 211, most significant bit (MSB) first, for an example embodiment, on a rising edge of C 203. Depending on the particular command code, the command code may be followed by additional address bytes, followed by dummy bytes and/or data bytes. The total number of input cycles for a command depends on the particular command code. Further, for this example, address bits may be latched at DI 211 on the rising edge of C. Also, cycles during which undefined (don't care) data are shifted onto DI 211 may be referred to as dummy clock cycles. Also, for an embodiment, as with the command code, the address, dummy, and data bytes are latched at DI 211 most significant bit first, for this example, although the scope of claimed subject matter is not limited in this respect.

Further, for an embodiment, depending upon the particular command code, data bytes may either be latched as input data at DI 211 or transmitted as output data from DO 212. For cycles that input data through DI 211, DO 212 may be set to a high impedance (Z) state.

Also for an embodiment, a rising edge of S# 205 may signal an end to the command sequence and may initiate a resetting of the SPI interface. A de-assertion of S# may also result in a termination of the output data stream for read operations, may bring DO 212 to a high Z state, and may also result in memory 200 entering a standby mode. Of course, these are merely examples of the possible results of a de-assertion of S# 205, and the scope of claimed subject matter is not limited in these respects.

FIG. 2b is a block diagram depicting an example embodiment of serial flash memory device 200 configured as a dual input/output interface. During a dual I/O command sequence, DI 211 and DO 212 may be referred to as DQ0 211 and DQ1 212, and may be utilized as either input or output terminals, depending on the state of the command sequence. Information may be latched into DQ0 211 and DQ1 212 on the rising edge of C 203, and information may be shifted out of terminals DQ0 211 and DQ1 212 on the falling edge of C 203.

A Dual Input Fast Program (DIFP) command, for an embodiment, makes it possible to program up to 256 bytes using terminals 211 and 212 concurrently as data input terminals. At the beginning of the command sequence, DQ0 211 may be used to latch the command code and address information.

A Dual Output Fast Read (DOFR) command, for an embodiment, makes it possible to read a data byte using two terminals DQ1 212 and DQ0 211 concurrently. Transmitting the information over two lines instead of one may effectively double the data transfer throughput compared to the Fast Read Data Bytes (Fast Read) command. DQ0 211 may be used to latch the command code and address information, for an embodiment.

Also, for an embodiment, a Dual I/O Fast Read (DIOFR) command may share many similarities with the DOFR command, discussed above, but it may also allow the input of the address using DQ0 211 and DQ1 212 concurrently as data output terminals. As with the commands discussed above, DQ0 211 may be used to latch the command code and address information.

FIG. 2c is a block diagram depicting an example embodiment of serial flash memory device 200 configured for quad input/output operations. For Quad I/O command sequences, for an embodiment, DQ0 211 and DQ1 212 terminals may be used as input and output terminals. Information may be latched on the rising edge of C 203, and information may be shifted out onto the terminals on the falling edge of C 203. During a quad I/O command sequence, at least in part in response to receiving the command code, the Vpp and Reset# 201 terminals may be re-purposed as input/output terminals DQ2 213 and DQ3 201, respectively.

For an embodiment, a Quad I/O Fast Read Data Bytes (QIOFR) command may allow reading information using four pins DQ3 201, DQ2 213, DQ1 212, and DQ0 211 concurrently as data output terminals. Transmitting data on four terminals instead of one may greatly improve throughput compared to the Fast Read command, noted above. For the QIOFR command, it may also be possible to receive the address over the same four terminals. As with other commands discussed above, DQ0 211 may be used to receive the command code.

Various configurations for serial flash memory 200 among those discussed above, along with various examples of command sequences including execute-in-place (XiP) read operations, are revisited below. Also, it should be noted that the operations, command sequences, and serial flash memory device configurations described herein are merely examples, and the scope of claimed subject matter is not limited in this respect.

For one or more embodiments, it may be advantageous to adapt one or more elements of one or more command sequences for some situations. For example, as discussed more fully below, it may be advantageous to adjust the number of dummy cycles in a command sequence. Other memory device configuration parameters such as output driver strength may also be adjusted in order to provide improved performance depending on conditions. Several example configuration parameters are described herein as examples. However, the scope of claimed subject matter is not limited to the specific examples described herein.

Figure 3:
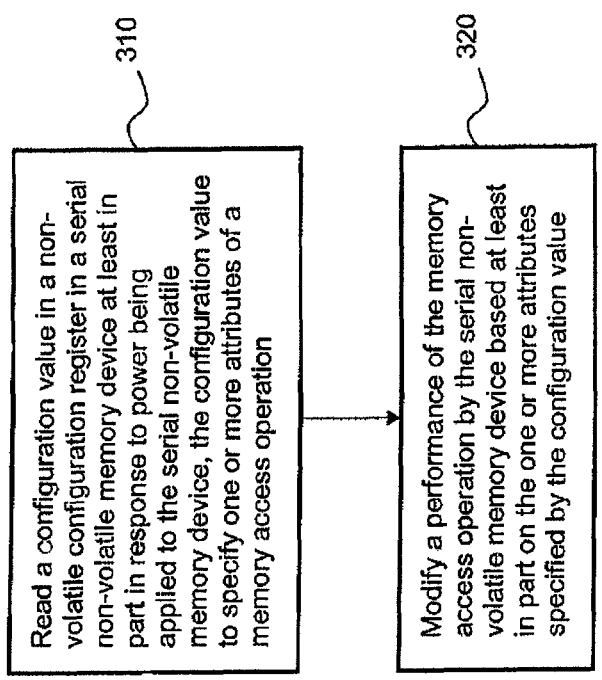
FIG. 3 is a flow diagram of an example embodiment of a method for configuring a serial flash memory device for a memory access operation.

FIG. 3 is a flow diagram of an example embodiment of a method for configuring a serial non-volatile memory device using a non-volatile configuration register. At block 310, a configuration value may be read from a non-volatile register in a serial non-volatile memory device at least in part in response to power being applied to the serial non-volatile memory device. The configuration value may specify one or more attributes of a memory access operation, for an embodiment. At block 320, a performance of the memory access operation may be modified based, at least in part, on the one or more attributes specified by the configuration value. Embodiments in accordance with claimed subject matter may include all, less than, or more than blocks 310-320. Also, the order of blocks 310-320 is merely an example order, and the scope of claimed subject matter is not limited in this respect.

As previously mentioned, for one or more embodiments, configuration register 124 may be implemented as a non-volatile configuration register. Also for one or more embodiments, configuration register 124 may comprise a plurality of flash memory cells, although the scope of claimed subject matter is not limited in this respect. By implementing the configuration register as a non-volatile memory, configuration parameters stored therein may be maintained even in the event of a power-down of serial flash memory device 200. Therefore, there may be no need to re-program memory device 200 upon a subsequent power-up of the memory device, and the clock cycles that would have been wasted in re-programming the memory device may be saved, resulting in reduced overhead and improved overall system performance.

For one or more embodiments, any of a number of configuration parameters may be stored in non-volatile configuration register 124. Table 1, below, comprises one example listing of configuration parameters along with example values for the various fields of the registers. Of course, the example depicted by Table 1 is merely one example, and the scope of claimed subject matter is not limited in these respects.

TABLE 1

Non-Volatile Configuration Register

| Bit | Parameter | Value | Description | Note |
| --- | --- | --- | --- | --- |
| NVCR <15:12> | Dummy Clock Cycles | 0000 | Reserved | To Improve instruction fetch performance (Fast Read, DOFR, DIOFR, QOFR, QIOFR) according |
| | | 0001 | 1 | |
| | | 0010 | 2 | |
| | | 0011 | 3 | |
| | | 0100 | 4 | |
| | | 0101 | 5 | |

TABLE 1-continued

Non-Volatile Configuration Register

| Bit | Parameter | Value | Description | Note |
|---|---|---|---|---|
| | | 0110 | 6 | to frequency |
| | | 0111 | 7 | |
| | | 1000 | 8 | |
| | | 1001 | 9 | |
| | | 1010 | 10 | |
| | | 1011 | Reserved | |
| | | 1100 | Reserved | |
| | | 1101 | Reserved | |
| | | 1110 | Reserved | |
| | | 1111 | Target on maximum allowed frequency and to guarantee backward compatibility | |
| NVCR <11:9> | | 000 | XiP for SIO Read | |
| | | 001 | XiP for DOFR | |
| | | 010 | XiP for DIOFR | |
| | | 011 | XiP for QOFR | |
| | | 100 | XiP for QIOFR | |
| | | 101 | Reserved | |
| | | 110 | Reserved | |
| | | 111 | XiP Disabled (default) | |
| NVCR <8:6> | | 000 | Reserved | Impedance at Vcc/2 |
| | | 001 | 90 | |
| | | 010 | 60 | |
| | | 011 | 45 | |
| | | 100 | Reserved | |
| | | 101 | 20 | |
| | | 110 | 15 | |
| | | 111 | 30 (default) | |
| NVCR <5> | First Access After Power-Up | 0 | Enabled | <200 µs - only read operations available |
| | | 1 | Disabled | 700 µs - all operations available |
| NVCR <4:0> | Reserved | xxxxx | Don't Care | Default value = 11111b |

As depicted in Table 1, for one or more embodiments, memory device 200 may implement a variable number of dummy dock cycles depending on operating frequency and the characteristics of the memory device. Trade-offs may also be made between reliability and performance, for an embodiment. By providing a programmable solution for adjusting the number of dummy cycles for various types of command sequences, it may be possible to deviate from the numbers of dummy cycles normally utilized for operations compatible with the SPI protocol, for example. The non-volatile nature of the configuration register further allows for an application executed on processor 110 to program memory device 200 once, and the memory device may maintain the programmed values indefinitely, thereby eliminating the need to re-program the memory device each time the device is started up. Thus, system overhead may be reduced, and overall system performance may be improved. Of course, non-volatile configuration register 124 may be re-programmed any number of times, if desired, although the scope of claimed subject matter is not limited in this respect.

Figure 4:
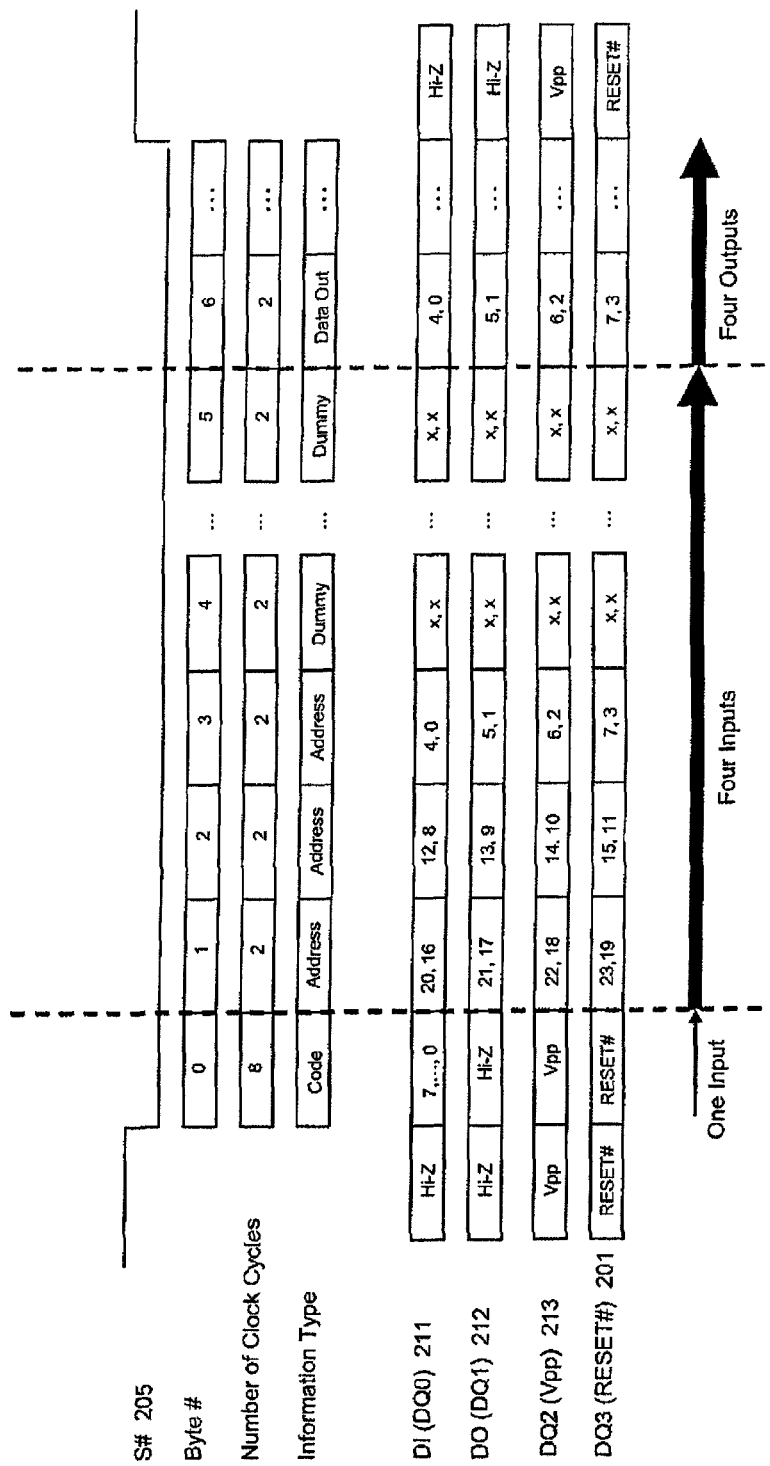
FIG. 4 is a diagram of an example embodiment of a quad input/quad output fast read operation.

FIG. 4 is a diagram of an example embodiment of a quad input/quad output fast read operation. This example demonstrates a number of dummy clock cycles between the address phase of the command sequence and the data phase. At byte 0, S# becomes asserted by processor 110, indicating that processor 110 is acting as the master and memory 200 is acting as slave, for this example, and a command code is presented by the processor to DI 211. For this particular command sequence, there is a single input on DI 211, and there are four outputs on terminals DQ0 211, DQ1 212, DQ2 213, and DQ3 201. For this example, four input terminals are used to shift in the address bytes. Specifically, the address is received during bytes 1-3 at DQ0 211, DQ1 212, DQ2 213, and DQ3 201. Data is shifted out of memory device 200 during byte 6 at DQ0 211, DQ1 212, DQ2 213, and DQ3 201.

For this example, four dummy cycles are depicted at bytes 4 and 5. However, as shown in Table 1, any of a range of possible numbers of dummy cycles may be specified, depending for the present example on the value stored in the NVCR <15:12> field of non-volatile configuration register 124. For one or more embodiments, any of a range of one to ten dummy cycles may be specified. However, the scope of claimed subject matter is not limited in this respect.

Figure 5:
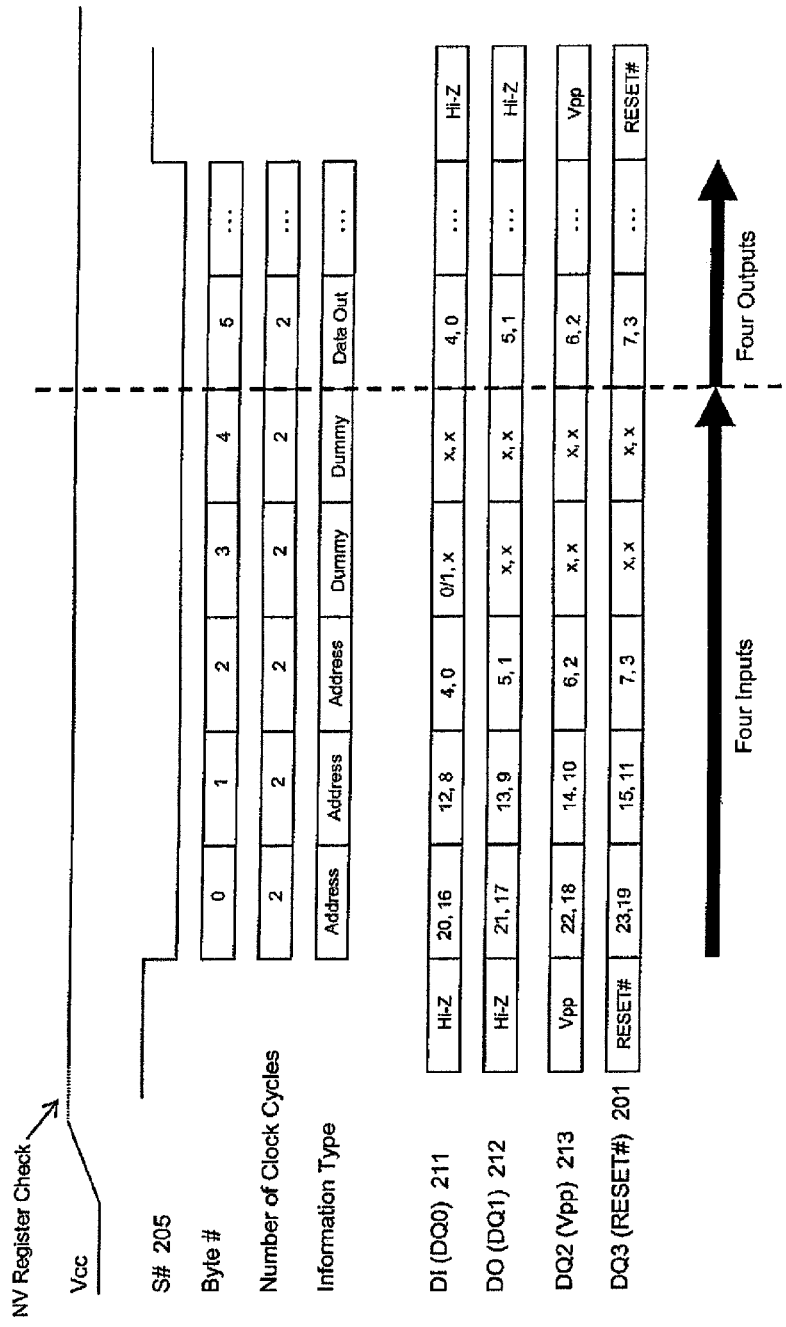
FIG. 5 is a diagram of an example embodiment of a quad input/quad output fast read operation in an example execute-in-place mode.

FIG. 5 is a diagram of an example embodiment of a quad input/quad output fast read operation in XiP mode. As used herein, the term "execute-in-place mode" or "XiP mode" is meant to include any mode of operation for a serial flash memory device that configures that memory device for improved performance for read operations initiated by a processor. For one or more embodiments described herein, the improved performance may comprise performing read operations without a command code being received by the memory device from the processor. Because this example command sequence of FIG. 5 is in XiP mode, no command code is presented to DQ0 211 at the beginning of the sequence. Rather, the sequence begins with the address. By eliminating the need for a command code, eight clock cycles may be saved for read operations, for one example embodiment, and read operation performance may be enhanced. For this example embodiment, the input information is received over four terminals, DQ0 211, DQ1 212, DQ2 213, and DQ3 201. Output data is transmitted over the same four output terminals DQ0 211, DQ1 212, DQ2 213, and DQ3 201. Also, although the example command sequence of FIG. 5 depicts four dummy cycles, other numbers of dummy cycles may be specified by writing appropriate values to NVCR <11:9> field, as shown in Table 1 and as described above in connection with FIG. 4.

As mentioned above, and as depicted in FIG. 1, serial flash memory device 200 may comprise a non-volatile configuration register 124 and a control unit 126. Configuration register 124 may be used to indicate that an XiP mode of operation has been entered. By storing the indication in a non-volatile register, memory device 200 may remember its current mode of operation even in the event of a system shutdown or reset. Memory device 200 may begin operation in the indicated XiP mode of operation upon a system restart. In this manner, there in no need for processor 100 to re-program memory device 200 to enter the XiP mode every time the system is restarted. Overall system performance may be improved, and user of the system may perceive a quicker start-up in some situations.

For one or more embodiments, a number of XiP modes of operation may be implemented in accordance with a number of different read operation types. Possible XiP mode read operations, for one or more embodiments, may include but are not limited to, Fast Read Data Bytes (Fast Read), Dual Output Fast Read Data Bytes (DOFR), Dual I/O Fast Read Data Bytes (DIOFR), Quad Output Fast Read Data Bytes (QOFR) and Quad I/O Fast Read Data Bytes (QIOFR) commands.

Non-Volatile configuration register 124 for an embodiment may be programmed through a Write to Configuration Register (WRCR) command. Also, for an embodiment, the contents of the non-volatile configuration register may be verified by way of a dedicated read operation which, for an embodiment, may comprise an eight-bit command code.

For an embodiment, non-volatile configuration register 124 may comprise flash memory cells, and may have a default value determined during the manufacturing process, for example. Also for an embodiment, the default value for the NVCR <11:9> field may comprise a value signifying an "XiP Disabled" mode. However, the scope of claimed subject matter is not limited in these respects.

For one or more embodiments, non-volatile configuration register 124 may store a value specifying an output driver strength. For example, Table 1 depicts possible impedance values ranging from 15 Ohms to 90 Ohms, as measured at Vcc/2. As also depicted in Table 1, for one or more embodiments, NVCR <8:6> field may be used to specify the output driver strength. However, the scope of claimed subject matter is not limited in these respects. The ability to program the driver strength and for the memory device to remember the programmed configuration may help to increase performance and/or to improve signal integrity. Of course, the driver strength value in NVCR <8:6> may be re-programmed for one or more embodiments should environmental circumstances warrant.

Also, for one or more embodiments, non-volatile register 124 may store a value indicating a minimum time for a first access after power-up. If a fast power-up mode is enabled by writing a '1' to NVCR <5>, read operations only may be available within the first 200 μs. If the fast power-up mode is not enabled, then after 700 μs have elapsed, for an embodiment, all memory access operations may be available. For situations in which memory device 200 is providing instructions 122 to processor 110, the fast power-up mode may enable system 100 to recover quicker from a low-power state to resume code fetch operations from memory device 200. Of course, these are merely examples of a fast power-up mode, and the scope of claimed subject matter is not limited to the specific details discussed herein.

As also depicted in Table 1, the NVCR <4:0> field is reserved for an embodiment for future use. For one or more embodiments, any of a wide range of possible memory device parameters may be programmable via non-volatile configuration register 124, and the scope of claimed subject matter is not limited to the specific examples discussed herein and/or depicted in the accompanying figures and table.

In the preceding description, various aspects of claimed subject matter have been described. For purposes of explanation, systems or configurations were set forth to provide an understanding of claimed subject matter. However, claimed subject matter may be practiced without those specific details. In other instances, well-known features were omitted or simplified so as not to obscure claimed subject matter. While certain features have been illustrated or described herein, many modifications, substitutions, changes or equivalents will now occur to those skilled in the art. It is, therefore, to be understood that the appended claims are intended to cover all such modifications or changes as fall within the true spirit of claimed subject matter.

The invention claimed is:

1. An apparatus comprising a serial non-volatile memory device, the apparatus comprising:
    a non-volatile configuration register of the serial non-volatile memory device configured to store a configuration value; and
    a control unit implemented in hardware or by software embodied in tangible non-transitory computer-readable storage media, wherein the control unit is configured to read the configuration value from the non-volatile configuration register at least when the serial non-volatile memory device is powered up, wherein the control unit is configured to adjust an output driver strength of the serial non-volatile memory device itself for a read operation based on the configuration value, wherein at least a portion of the configuration value specifies the output driver strength;
    wherein the configuration value further specifies a configurable minimum time before first access after power-up for the serial non-volatile memory device, and wherein the control unit is further configured to inhibit memory access operations until the minimum time elapses, wherein the configurable minimum time is configurable between at least two different minimum times.

2. The apparatus of claim 1, wherein the configuration value specifies an output driver strength in the range of 15 ohms to 90 ohms.

3. The apparatus of claim 1, wherein the non-volatile configuration register comprises a plurality of flash memory cells.

4. The apparatus of claim 1, wherein the non-volatile configuration register is configured to be updated at least in part in response to the serial non-volatile memory device receiving a subsequent configuration value from a processor.

5. The apparatus of claim 1, wherein the serial non-volatile memory device comprises a serial flash memory device.

6. The apparatus of claim 1, wherein the configurable minimum time is configurable between at least 200 microseconds and 700 microseconds.

7. The apparatus of claim 1, wherein the configuration value further specifies an execute-in-place mode for the read operation.

8. An electronically-implemented method of configuring a serial non-volatile memory device, the method comprising:
   reading a configuration value in a non-volatile configuration register of the serial non-volatile memory device at least in part in response to power being applied to the serial non-volatile memory device;
   adjusting an output driver strength of the serial non-volatile memory device itself for a read operation based on the configuration value at least in part in response to power being applied to the serial non-volatile memory device, wherein at least a portion of the configuration value specifies the output driver strength;
   wherein the configuration value further specifies a configurable minimum time before first access after power-up for the serial non-volatile memory device, and
   inhibiting memory access operations until the minimum time elapses, wherein memory access operations are inhibited until the minimum time elapses, wherein the configurable minimum time is configurable between at least two different minimum times.

9. The method of claim 8, wherein the configuration value specifies an output driver strength in the range of 15 ohms to 90 ohms.

10. The method of claim 8, wherein the non-volatile configuration register comprises a plurality of flash memory cells.

11. The method of claim 8, further comprising updating the non-volatile configuration register at least in part in response to the serial non-volatile memory device receiving a subsequent configuration value from a processor.

12. The method of claim 8, wherein the serial non-volatile memory device comprises a serial flash memory device.

13. The method of claim 8, wherein the configurable minimum time is configurable between at least 200 microseconds and 700 microseconds.

14. The method of claim 8, wherein the configuration value further specifies an execute-in-place mode for the read operation.

15. A system, comprising:
   a processor; and
   a serial non-volatile memory device coupled to the processor, the memory device comprising:
      a non-volatile configuration register of the serial non-volatile memory device configured to store a configuration value; and
      a control unit implemented in hardware or by software embodied in tangible non-transitory computer-readable storage media configured to read the configuration value from the non-volatile configuration register at least when the serial non-volatile memory device is powered up, wherein the control unit is configured to adjust an output driver strength of the serial non-volatile memory device itself for a read operation based on the configuration value, wherein at least a portion of the configuration value specifies the output driver strength;
      wherein the configuration value further specifies a configurable minimum time before first access after power-up for the serial non-volatile memory device, and wherein the control unit is further configured to inhibit memory access operations until the minimum time elapses, wherein the configurable minimum time is configurable between at least two different minimum times.

16. The system of claim 15, wherein the configuration value specifies an output driver strength in the range of 15 ohms to 90 ohms.

17. The system of claim 15, wherein the non-volatile configuration register comprises a plurality of flash memory cells.

18. The system of claim 15, wherein the serial non-volatile memory device comprises a serial flash memory device.

19. The system of claim 15, wherein the configurable minimum time is configurable between at least 200 microseconds and 700 microseconds.

20. The system of claim 15, wherein the configuration value further specifies an execute-in-place mode for the read operation.

* * * * *